United States Patent
Ma

(10) Patent No.: US 10,128,805 B2
(45) Date of Patent: Nov. 13, 2018

(54) PROGRAMMABLE GAIN STAGE BASED ON WIDTH RATIO OF TWO MOSFETS

(71) Applicant: Futurewei Technologies, Inc., Plano, TX (US)

(72) Inventor: Huainan Ma, Laguna Hills, CA (US)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 0 days.

(21) Appl. No.: 15/487,134

(22) Filed: Apr. 13, 2017

(65) Prior Publication Data

US 2018/0302051 A1 Oct. 18, 2018

(51) Int. Cl.
*H03G 3/30* (2006.01)
*H03F 3/45* (2006.01)
*H03G 1/00* (2006.01)

(52) U.S. Cl.
CPC ............. *H03G 3/30* (2013.01); *H03F 3/4521* (2013.01); *H03G 1/0029* (2013.01); *H03F 2203/45026* (2013.01)

(58) Field of Classification Search
CPC ....................................................... H03G 3/30
See application file for complete search history.

(56) References Cited

U.S. PATENT DOCUMENTS

| | | | | |
|---|---|---|---|---|
| 5,872,475 A * | 2/1999 | Otaka | ................. | H03G 1/0088 327/306 |
| 6,784,741 B1 * | 8/2004 | Redman-White | ........................... | H03F 3/45103 330/252 |
| 7,167,053 B2 * | 1/2007 | Abadeer | ................... | H03F 3/16 330/253 |
| 2010/0039141 A1 * | 2/2010 | Ou | ......................... | G01R 19/04 327/62 |
| 2011/0150038 A1 * | 6/2011 | Korol | .................... | H03F 1/3211 375/130 |
| 2016/0241285 A1 * | 8/2016 | Rafi | ....................... | H04B 1/123 |

\* cited by examiner

*Primary Examiner* — Patricia T Nguyen
(74) *Attorney, Agent, or Firm* — Garlick & Markison; Bruce E. Garlick

(57) ABSTRACT

An apparatus and method are provided for controlling the gain of a common source differential amplifier. The common source differential amplifier includes a pair of a metal-oxide-semiconductor field effect transistors (MOSFETs) each including a gate, a drain, and a source and at least one common source degeneration MOSFET in electrical communication between the sources of the pair of MOSFETs, the at least one common source degeneration MOSFET including a plurality of gate structures. A controller is in electrical communication with the gate structures and is configured to selectively activate one or more of the gate structures for controlling the gain of the common source differential amplifier.

18 Claims, 7 Drawing Sheets

PROGRAMMABLE GAIN STAGE BASED ON WIDTH RATIO OF TWO MOSFETS

FIELD OF THE INVENTION

The present disclosure relates to differential amplifier circuits, and more particularly to a common source differential amplifier circuit including digital programmable gain control.

BACKGROUND

Differential amplifiers are used to amplify a differential analog input signals and produce differential output signals. A differential amplifier may be configured to function as a comparator, transmitter, various amplifiers (operational, sense, etc.), an up-converter mixer, and as a gain buffer stage, and the like.

Conventional common source differential amplifier circuits rely on tuning the value of a resistor to control either the range of the voltage gain or increments of adjustment for the gain (i.e., step size). A resistor at the load of the common source differential amplifier circuit or a source degeneration resistor coupled between the sources of input transistors is tuned to increase or decrease the resistance, thereby changing the voltage gain of the common source differential amplifier circuit. In the context of the following description, the transistors are metal-oxide-semiconductor field-effect transistors (MOSFETs).

A tunable resistor is constructed as an array of switches and polysilicon resistors. The switches control the resistance by enabling one or more of the resistors in the array. However, the tunable resistor has several disadvantages. In silicon, the layout of the tunable resistor consumes a large area, especially when a resistor having a small resistance is fabricated using polysilicon because the width and length of the resistor structure are increased to construct a resistor having smaller resistance. The tunable resistor typically occupies an area that is ten times larger than the input transistors. A larger area results in greater parasitic capacitances and poor high frequency performance.

The performance characteristics of the tunable resistor do not track the characteristics of the MOSFETs for variations in fabrication process, operating voltage, and operating temperature because the structure of a resistor, as fabricated in silicon, differs from a MOSFET. Therefore process corner performance of the common source differential amplifier circuit suffers due to differing variations in the process, voltage, and temperature (PVT) performance between the MOSFETs and tunable resistor(s). For example, resistors constructed of polysilicon that are included in the tunable resistor do not necessarily respond to variations in the fabrication process, variations in voltage levels (e.g., high and low power supply voltages and signal levels), and variations in temperature during operation in the same manner as MOSFETs that are constructed of polysilicon and additional materials. Specifically, in one example, the resistance of the tunable resistor may be unchanged for variations in temperature while the switching speed of the MOSFETs increases as the temperature is reduced. Failure of the tunable resistors to track the MOSFETs across PVT variations detrimentally affects linear voltage control. Consequently, the voltage gain range is reduced and the step size is inconsistent.

Therefore, it is desirable to construct a common source differential amplifier with programmable voltage gain range and step control that is relatively consistent across PVT variations.

SUMMARY

According to one aspect of the present disclosure, there is provided an apparatus that includes: a common source differential amplifier. Components of the common source differential amplifier include a pair of metal-oxide-semiconductor field effect transistors (MOSFETs), at least one common source degeneration MOSFET, and a controller. The MOSFETs in the pair of MOSFETs each include a gate, a drain, and a source. The at least one common source degeneration MOSFET is in electrical communication between the sources of the pair of MOSFETs and includes a plurality of gate structures. The controller is in electrical communication with the gate structures and is configured to selectively activate one or more of the gate structures for controlling a gain of the common source differential amplifier.

Optionally, in any of the preceding aspects, the controller controls the gain by controlling a ratio between a first width of the gate of each of the pair of MOSFETs, and a second width of the collective gate structures that are activated.

Optionally, in any of the preceding aspects, the first width is fixed, and the gate structures each include one or more MOSFETs of the first width.

Optionally, in any of the preceding aspects, the controller is configured to set the gain in equal size adjustment increments.

Optionally, in any of the preceding aspects, an effective resistance of the at least one common source degeneration MOSFET is a function of the ratio.

Optionally, in any of the preceding aspects, each of the pair of MOSFETs and the at least one common source degeneration MOSFET, each have at least one common aspect including at least one of: a common type, a common gate length, a common electron mobility, a common gate capacitance, or a common circuit layout topology.

Optionally, in any of the preceding aspects, the common source differential amplifier is configured such that the gain control is independent of at least one of a process by which the common source differential amplifier is manufactured, a voltage at which the common source differential amplifier operates, or a temperature at which the common source differential amplifier operates.

Optionally, in any of the preceding aspects, the common source differential amplifier includes at least two of the common source degeneration MOSFETs that are serially coupled between the sources of the pair of MOSFETs.

Optionally, in any of the preceding aspects, the controller is configured for controlling the gain of the common source differential amplifier, without a resistor in electrical communication between the sources of the pair of MOSFETs.

Optionally, in any of the preceding aspects, a first gate structure has a second width that is larger than the first width and a second gate structure has a third width that is larger than both the first width and the second width.

According to one aspect of the present disclosure, there is provided a method of controlling a gain of a common source differential amplifier that includes: receiving a gain code at a controller that is in electrical communication with a plurality of gate structures of at least one common source degeneration metal-oxide-semiconductor field effect transistor (MOSFET); selectively activating one or more of the gate structures for controlling the gain of the common source differential amplifier according to the gain code; and amplifying, based on the gain, a differential voltage signal received by a pair of a MOSFETs each including a gate, a drain, and a source, where the at least one common source degeneration MOSFET is connected between the sources of the pair of MOSFETs.

Optionally, in any of the preceding aspects, the controller controls the gain by controlling a ratio between a first width of the gate of each of the pair of MOSFETs, and a second width of the collective gate structures that are activated.

Optionally, in any of the preceding aspects, the first width is fixed, and the gate structures each include one or more MOSFETs of the first width.

Optionally, in any of the preceding aspects, the controller is configured to set the gain in equal size adjustment increments.

Optionally, in any of the preceding aspects, an effective resistance of the at least one common source degeneration MOSFET is a function of the ratio.

Optionally, in any of the preceding aspects, each of the pair of MOSFETs and the at least one common source degeneration MOSFET, each have at least one common aspect including at least one of: a common type, a common gate length, a common electron mobility, a common gate capacitance, or a common circuit layout topology.

Optionally, in any of the preceding aspects, the common source differential amplifier is configured such that the gain control is independent of at least one of a process by which the common source differential amplifier is manufactured, a voltage at which the common source differential amplifier operates, or a temperature at which the common source differential amplifier operates.

Optionally, in any of the preceding aspects, the common source differential amplifier includes at least two of the common source degeneration MOSFETs that are serially coupled between the sources of the pair of MOSFETs.

Optionally, in any of the preceding aspects, the controller is configured for controlling the gain of the common source differential amplifier, without a resistor in electrical communication between the sources of the pair of MOSFETs.

Optionally, in any of the preceding aspects, a first gate structure has a second width that is larger than the first width and a second gate structure has a third width that is larger than both the first width and the second width.

DETAILED DESCRIPTION

In one embodiment, the gain and step size (adjustment increment) of a common source differential amplifier is programmable. In one embodiment, a source degeneration MOSFET included in the common source differential amplifier is programmed to control a gate width of the source degeneration MOSFET circuit. The gain range and accuracy of the common source differential amplifier is based on a ratio (i.e., a width ratio) of a selected gate width of the source degeneration MOSFET circuit to a fixed gate width of input MOSFETs. The gate width of the input MOSFETs equals the gate width of one of the input MOSFETs. In the context of the following description, the gate width is the width of the MOSFET, specifically the width of the gate material as fabricated in silicon and corresponds with the channel width. The width ratio needed to produce a linear attenuation for different digital gain control codes may be configured in a circuit implementation of the common source differential amplifier circuit.

The source degeneration MOSFET circuit closely tracks the pair of input MOSFETs across PVT variations, thereby enabling linear voltage control. In contrast with a conventional fixed or tunable resistor, both of which are passive linear devices fabricated in polysilicon, the source degeneration MOSFET circuit is an active non-linear device. The structure of the MOSFETs in the source degeneration MOSFET and the pair of input MOSFETs, as fabricated in silicon, is the same and includes other materials in addition to polysilicon. In particular, the channel resistance provided by the source degeneration MOSFET will not track the polysilicon resistance of a fixed or tunable resistor for PVT variations. In contrast, the behavior of the source degeneration MOSFET and pair of input MOSFETs for PVT variations is the same. Therefore, performance of the gain control feature of the common source differential amplifier is relatively independent of PVT variations.

Figure 1:
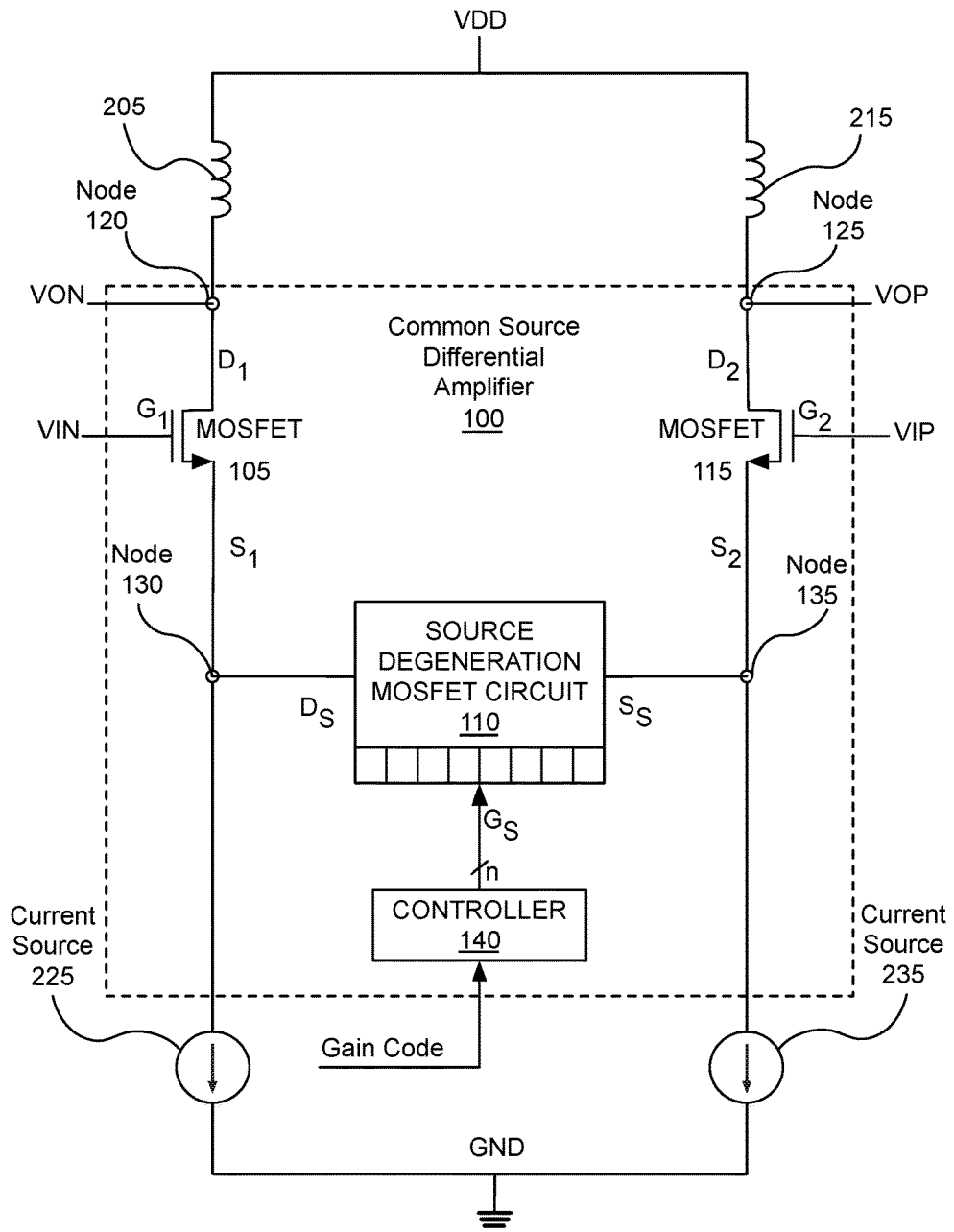
FIG. 1 illustrates a common source differential amplifier, in accordance with one embodiment.

FIG. 1 illustrates a common source differential amplifier 100, in accordance with one embodiment. The common source differential amplifier 100 may be configured to operate as a programmable gain stage circuit. The common source differential amplifier 100 includes a pair of input MOSFETs 105 and 115. The MOSFET 105 has a source $S_1$ terminal, gate $G_1$ terminal, and drain $D_1$ terminal at a node 120. The MOSFET 115 has a source $S_2$ terminal, gate $G_2$ terminal, and drain $D_2$ terminal at a node 125. The source degeneration MOSFET circuit 110 has a source $S_S$ terminal, gate $G_S$ terminal, and drain $D_S$ terminal and is coupled between the source terminals $S_1$ and $S_2$ at nodes 130 and 135, respectively. A common source amplifier with a series resistance in the source circuit is referred to as a common source amplifier with source degeneration. In the common source differential amplifier 100, the channel of the source degeneration MOSFET circuit 110 provides the resistance, and is therefore referred to as a source degeneration MOSFET. The resistance of the source degeneration MOSFET circuit 110 is determined by the programmable gate width of the source degeneration MOSFET circuit 110. The resistance decreases and the gate width increases. The input MOSFETs 105 and 115 are referred to as gm MOSFETs that provide amplification.

A first constant current source circuit, represented by a current source symbol 225 is coupled between the node 130 and a ground supply voltage. A second constant current source circuit, represented by a current source symbol 235 is coupled between the node 135 and the ground supply voltage. The direct current (DC) through the input MOSFETs 105 and 115 is constant and unchanged, even as the gain of the common source differential amplifier 100 varies.

In one embodiment, the common source differential amplifier 100 also includes a controller 140 that is coupled to a source degeneration MOSFET circuit 110. In one embodiment, the controller 140 is separate and is not included in the common source differential amplifier 100.

The gates $G_1$ and $G_2$ of the input MOSFETs 105 and 115, respectively, receive the differential input signals VIN and VIP, respectively. The differential output signals VON and VOP are generated at the nodes 120 and 125, respectively. Inductors 205 and 215 are coupled between the nodes 120 and 125, respectively, and a power supply voltage VDD. The inductors 205 and 215 provide a load for the common source differential amplifier 100 and may be replaced with other circuit elements.

In one embodiment, the source degeneration MOSFET circuit 110 is used in place of a tunable resistor and no resistor is coupled between the nodes 130 and 135. In one embodiment, gate lengths of the input MOSFETs 105 and 115 and the source degeneration MOSFET circuit 110 are equal. In one embodiment, the circuit layout topology of the MOSFETs 105 and 115 and the source degeneration MOSFET circuit 110 are similar. For example, not only do the MOSFETs 105 and 115 and the source degeneration MOSFET circuit 110 have the similarly sized channel and gate structures, but the layout and routing of various fabricated layers (e.g., diffusion, polysilicon, contacts, and metal) of the MOSFETs 105 and 115 and the gate structures within the source degeneration MOSFET circuit 110 are similar. In one embodiment, an electron mobility of the input MOSFETs 105 and 115 and the source degeneration MOSFET circuit 110 are equal. In one embodiment, the electron mobility of the input MOSFETs 105 and 115 and the source degeneration MOSFET circuit 110 differ in value by less than 10%.

The source degeneration MOSFET circuit 110 includes a plurality of gate structures that are controlled by the controller 140. The controller 140 may be programmed by a digital gain code signal to selectively activate one or more of the gate structures of the source degeneration MOSFET circuit 110 for controlling a gain of the common source differential amplifier. Activating different combinations of the gate structures modifies the gate width of the source degeneration MOSFET circuit 110 which, in turn, modifies the value of a width ratio between the width of the selected gate structures in the source degeneration MOSFET circuit 110 and the fixed gate width of either of the input MOSFETs 105 and 115. The selected gate structures are the gate structures that are activated and the width of the selected gate structures is a sum of the widths of the selected gate structures. In one embodiment, the input MOSFETs 105 and 115 each have a first gate width and one or more MOSFETs within each one of the gate structures in the source degeneration MOSFET circuit 110 also have the first gate width. In one embodiment, an effective resistance of the source degeneration MOSFET circuit 110 is controlled by the width ratio. The width ratio is a ratio of the selected gate width of the source degeneration MOSFET circuit 110 to the gate width of either the input MOSFET 105 or 115. In one embodiment, the gain of the common source differential amplifier 100 is controlled by the gain code and the gain is independent of at least one of a process by which the common source differential amplifier is manufactured, a voltage at which the common source differential amplifier 100 operates, or a temperature at which the common source differential amplifier operates 100.

In one embodiment, neither fixed nor tunable resisters are included in the source degeneration MOSFET circuit 100, therefore the source degeneration MOSFET circuit consumes less silicon area compared with the conventional tunable resistor constructed as an array of switches and polysilicon resistors. The smaller area results in fewer parasitic capacitances and improved high frequency performance. The conventional tunable resistor is constructed to provide a low resistance that is needed to achieve a high gain. Smaller resistors require more silicon area to construct compared with large resistors.

Figure 2:
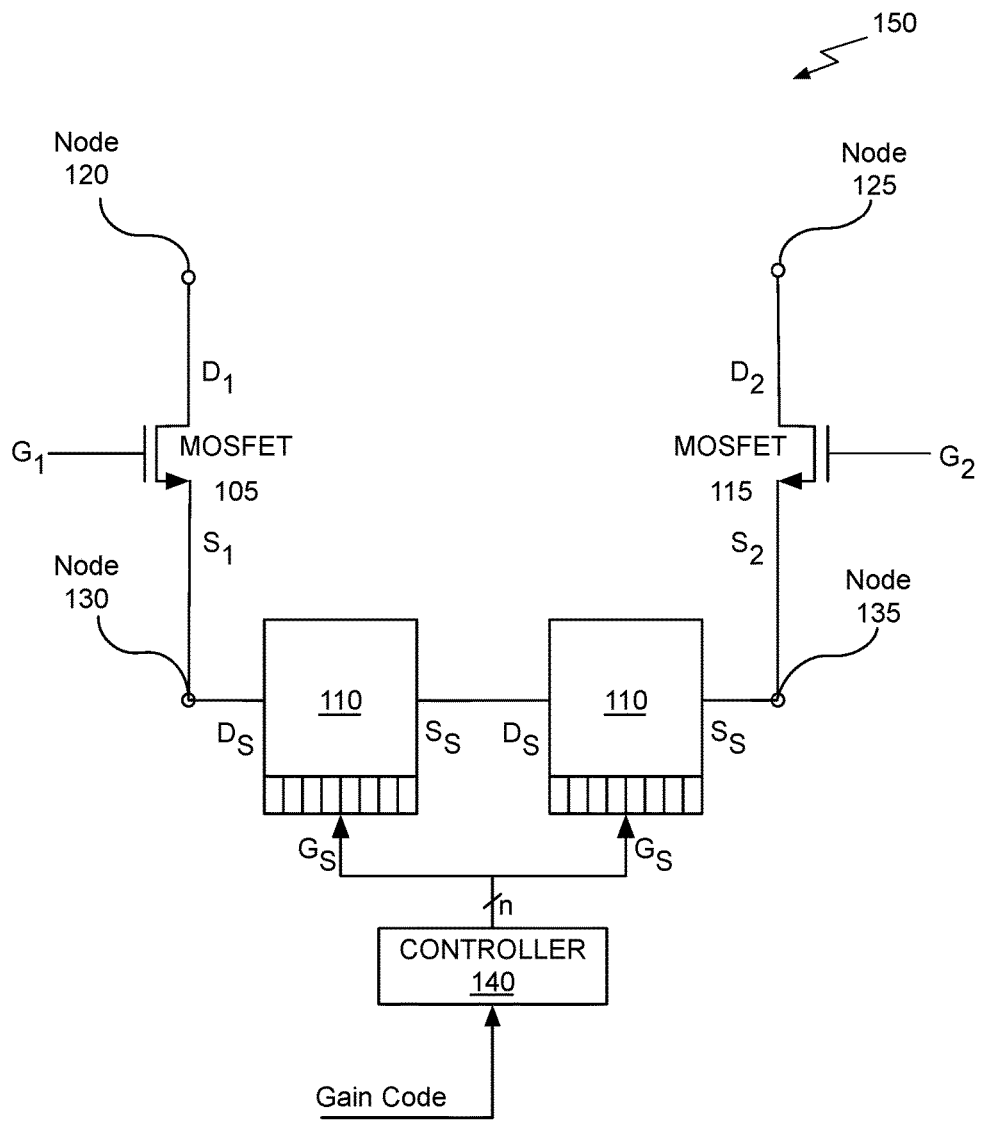
FIG. 2 illustrates another common source differential amplifier, in accordance with one embodiment.

FIG. 2 illustrates another common source differential amplifier 150, in accordance with one embodiment. Compared with the common source differential amplifier 150, the source degeneration MOSFET circuit 110 is replaced with two source degeneration MOSFET circuits 110 that are coupled in series and are each controlled by the controller 140. In one embodiment, one or more additional source degeneration MOSFET circuits 110 are coupled in series with the two source degeneration MOSFET circuits 110 and each source degeneration MOSFET circuit 110 is controlled by the controller 140. When multiple source degeneration MOSFET circuits 110 are used, the controller 140 may provide separate gain controls to each one of the source degeneration MOSFET circuits 110. The controller 140 may be included in the common source differential amplifier 150 or may be separate from the common source differential amplifier 150.

As an option, the common source differential amplifiers 100 and 150 may be implemented in the context of any one or more of the embodiments set forth in any subsequent figure(s) and/or description thereof. However, it is to be appreciated that the common source differential amplifiers 100 and 150 may be implemented in the context of any desired environment.

More illustrative information will now be set forth regarding various optional architectures and uses in which the foregoing technique may or may not be implemented, in accordance with other embodiments. It should be strongly noted that the following information is set forth for illustrative purposes and should not be construed as limiting in any manner. Any of the following features may be optionally incorporated with or without other features described.

The voltage gain, $V_G$, of the common source differential amplifiers 100 and 150 is expressed as:

$$V_G = \frac{g_m Z_L}{1 + g_m R_S}, \qquad \text{(Eq. 1)}$$

where $g_m$ is the transconductance of the input MOSFETs 105 and 115, $Z_L$, is the load impedance, and $R_S$ is the source degeneration resistance. A normalized voltage gain, $V_G^N$ is computed by scaling the voltage gain $V_G$ by the maximum value of $V_G$. The maximum value of $V_G$ occurs when the source degeneration resistance is zero. The normalized voltage gain is defined as:

$$V_G^N = \frac{V_G}{g_m Z_L} = \frac{1}{1 + g_m R_S}. \qquad \text{(Eq. 2)}$$

The ideal transconductance $g_m$ of the input MOSFETs 105 and 115 operating in the saturation region is:

$$g_m = \mu_n C_{ox} \frac{W}{L}(V_{GS} - V_{TH}). \quad \text{(Eq. 3)}$$

The channel resistance of the source degeneration MOSFET circuit 110 is:

$$R_S = \frac{1}{\mu_n C_{ox} \frac{W_S}{L}(V_{GS\_Ss} - V_{TH})}. \quad \text{(Eq. 4)}$$

Importantly, the input MOSFETs 105 and 115 have the same gate length, the same circuit layout topology, the same transistor type, and the same transistor characteristics (mobility $\mu_n$, gate capacitance $C_{ox}$) as the MOSFETs in the source degeneration MOSFET circuit 110. Transistor types include NMOS, PMOS, shallow MOSFETs, ultra-low power MOSFETs, fast-fast MOSFETs, and the like. Therefore, substituting $g_m$ defined by Equation (3) and $R_S$ defined by Equation (4) into Equation (2) gives:

$$V_G^N = \left(1 + \frac{W}{W_S} * f\right)^{-1} = \left(1 + \frac{f}{K_S}\right)^{-1}, \quad \text{(Eq. 5)}$$

where $$K_S \equiv \frac{W_S}{W}$$

and $$f = \frac{V_{GS} - V_{TH}}{V_{DD} - V_{SS} - V_{TH}}.$$

$V_{GS\_Ss}$ is the gate to source voltage of the source degeneration MOSFET circuit 110. Therefore, if gate voltage is set at $V_{DD}$ (power supply voltage) by the controller 140 and the source voltage of the source degeneration MOSFET circuit 110 is $V_{SS}$, then $V_{GS\_Ss} = V_{DD} - V_{SS}$ and $V_{GS\_Ss} - V_{TH} = V_{DD} - V_{SS} - V_{TH}$).

W is the gate width of the input MOSFETs 105 and 115, $W_S$ is the gate width of the source degeneration circuit MOSFET 110), $V_{DD}$ is the power supply voltage, $V_{SS}$ is the voltage at the source of the source degeneration MOSFET circuit 110, and $V_{TH}$ is the threshold voltage of the input MOSFETs 105 and 115 and the source degeneration MOSFET circuit 110. $K_S$ is a width ratio parameter that is the ratio of two MOSFET widths, namely the width of the source degeneration MOSFET circuit 110 and the width of either the input MOSFET 105 or 115. The parameter f is independent of MOSFET gate widths and is a constant that is determined by the fabrication process and power supply voltage. The gate width W of the width of the input MOSFETs 105 or 115 is fixed and may be determined based on a maximum gain, linearity and DC specification of the differential amplifier. The gate width, $W_S$ of the source degeneration MOSFET circuit 110 is variable and is selected based on the gain code.

The normalized voltage gain in decibels (dB), $V_G^N$ (dB) is therefore:

$$V_G^n(dB) = -20 \log\left(1 + \frac{f}{K_S}\right). \quad \text{(Eq. 6)}$$

the width ratio $K_S$, the amplifier gain (e.g., attenuation) can be precisely controlled in the common source differential amplifier 100 and 150. In contrast with conventional techniques that rely on a tunable resistor, controlling the gain by selecting the width ratio is not sensitive to PVT variations, because the input MOSFETs 105 and 115 and the MOSFETs in the source degeneration MOSFET circuit 110 are the same transistor type, the performance characteristics of the input MOSFETs 105 and 115 and the MOSFETs in the source degeneration MOSFET circuit 110 track each other. By varying the width ratio, the common source differential amplifier 100 and 150 may be designed to have a linear gain in dB for different values of the digital gain control code.

The gain code controls the source degeneration MOSFET circuit 110, to set the gain of the common source differential amplifier 100, so that the differential input signals are amplified, based on the gain, to produce the differential output signals.

Figure 3:
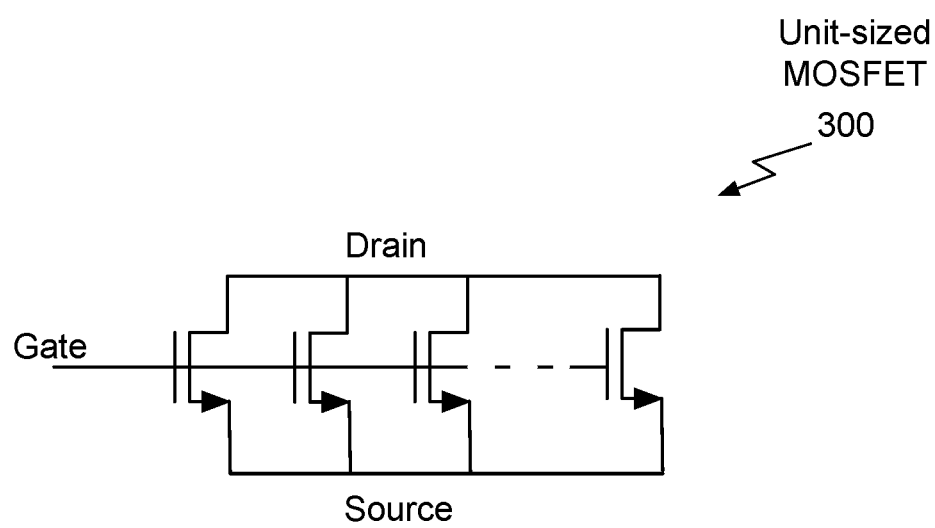
FIG. 3 illustrates a wide MOSFET constructed of multiple MOSFETs, in accordance with one embodiment.

FIG. 3 illustrates a unit-sized MOSFET 300 constructed of multiple MOSFETs connected in parallel to construct a wide MOSFET, accordance with one embodiment. Specifically, the unit-sized MOSFET 300 is constructed by connecting the gate terminals of the multiple MOSFETs together, connecting the source terminals of the multiple MOSFETs together, and connecting the drain terminals of the multiple MOSFETs together. The unit-sized MOSFET 300 may be used to construct an even wider MOSFET by coupling one or more of the unit-sized MOSFETs 300 in parallel. The unit-sized MOSFET 300 comprises N MOSFETs, where N is an integer greater than or equal to one. The width of the unit-sized MOSFET 300 is fixed.

In one embodiment, the input MOSFETs 105 and 115 are each a fixed width MOSFET constructed using one or more unit-sized MOSFETs 300. In contrast, the width of the source degeneration MOSFET circuit 110 is programmable. In one embodiment, each gate structure in the source degeneration MOSFET circuit 110 includes one fixed width MOSFET. In one embodiment, the input MOSFETs 105 and 115 are MOSFETs of width W=120×1 μm and a fixed length of 60 nm, where 120 unit-sized MOSFETs, each having a width of 1 μm are connected together in parallel to form a MOSFET having a fixed width of 120m. In one embodiment, the source degeneration MOSFET circuit 110 is a programmable width MOSFET having a maximum width W=120×1 μm and a fixed length of 60 nm. One or more of the gate structures in the source degeneration MOSFET circuit 110 may be implemented as fixed width MOSFETs. The width of the source degeneration MOSFET circuit 110 may be programmed to be less than or equal to the maximum width. In one embodiment, the source degeneration MOSFET circuit 110 should be at least as wide as the input MOSFETs 105 and 115.

Figure 4:
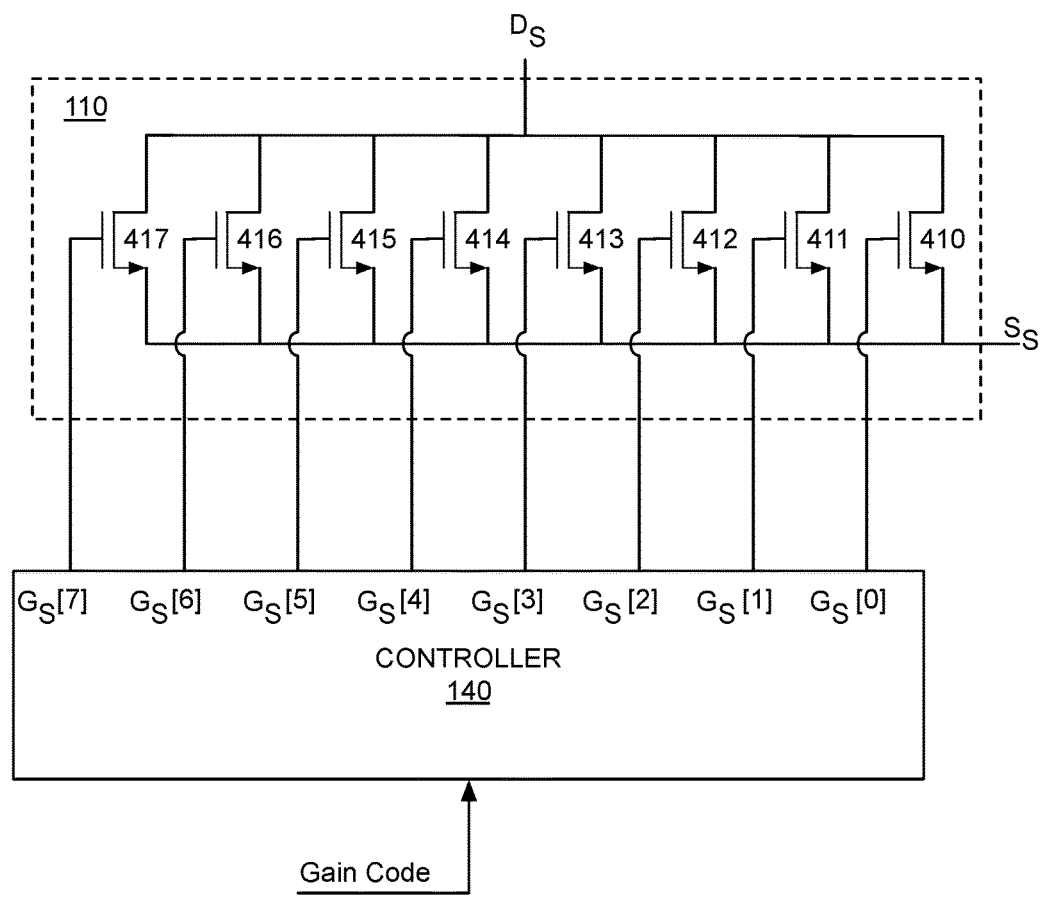
FIG. 4 illustrates the controller and plurality of gate structures in the source degeneration MOSFET circuit of FIGS. 1 and 2, in accordance with one embodiment.

FIG. 4 illustrates the controller 140 and plurality of gate structures 410, 411, 412, 413, 414, 415, 416, and 417 in the source degeneration MOSFET circuit 110 of FIGS. 1 and 2, in accordance with one embodiment. The drains of the gate structures 410, 411, 412, 413, 414, 415, 416, and 417 are connected together to provide the terminal $D_S$. The sources of the gate structures 410, 411, 412, 413, 414, 415, 416, and 417 are connected together to provide the terminal $S_S$. In one embodiment, each one of the gate structures 410, 411, 412, 413, 414, 415, 416, and 417 is a wide MOSFET, constructed using one or more unit-sized MOSFETs 300.

Each one of the gate structures 410, 411, 412, 413, 414, 415, 416, and 417 can be selectively activated by a bit of the Gs[7:0] signal that is generated by the controller 140. The controller 140 receives a 3-bit gain code and generates the Gs[7:0] signal to selectively activate one or more of the gate structures 410, 411, 412, 413, 414, 415, 416, and 417. Controlling the width of the source degeneration MOSFET circuit 110 sets a width ratio between $W_S$, the effective width of the collective gate structures 410, 411, 412, 413, 414, 415, 416, and 417 that are activated, and W, the width of the gate of each one of the input MOSFETs 105 and 115. In one embodiment, the width of each one of the gate structures 410, 411, 412, 413, 414, 415, 416, and 417 are equal. In one embodiment, the width of one or more of the gate structures 410, 411, 412, 413, 414, 415, 416, and 417 is different than any of the other gate structures 410, 411, 412, 413, 414, 415, 416, and 417.

When all of the gate structures 410, 411, 412, 413, 414, 415, 416, and 417 are selectively activated, the voltage gain of the common source differential amplifier 100 and 150 is maximized. The maximum voltage gain is normalized as an attenuation of 0 dB. The gain and attenuation is controlled in approximately equal step sizes. In one embodiment, the approximately equal set sizes are within 5% of 1.0. The number of gate structures implemented in the common source differential amplifier 100 may be increased or decreased to equalize the step sizes.

Based on circuit simulation and/or testing of the common source differential amplifier 100, a fixed width is determined for each one of the individual gate structures 410, 411, 412, 413, 414, 415, 416, and 417 to provide the desired gain and step sizes. All 120 unit-width MOSFETs in source degeneration MOSFET circuit 110 are activated according to a first gain code for the maximum gain. To reduce the gain by 1 dB, the gate structures 410, 411, 412, 413, 414, 415, and 416 are activated and the gate structure 417 is deactivated according to a second gain code. In one embodiment, the gate structure 417 includes 74 unit-width MOSFETs. To reduce the gain by another 1 dB, the gate structures 410, 411, 412, 413, 414, and 415 are activated and the gate structures 416 and 417 are deactivated according to a third gain code, and so on.

In one embodiment, the unit-width MOSFETs in the source degeneration MOSFET circuit 110 are partitioned between the 410, 411, 412, 413, 414, 415, 416, and 417 as shown in TABLE 1. The first column is the goal value for the attenuation targeted. As shown the goal attenuation increments linearly by a step size of 1 dB and has a range from 0-7 dB. In another embodiment, the goal attenuation increments linearly by a step size that is smaller or larger than 1 dB (e.g., 0.5 dB or 2 dB). In another embodiment, the goal attenuation has a range that is smaller or greater than 0-7 dB.

TABLE 1

Partitioning of the gate structures selected by the gain code for linear attenuation

| Goal Attenuation (dB) | Unit-width MOSFET count | Gain (dB) | Attenuation (dB) | unit-width MOSFET partitioning | Binary Gain code |
|---|---|---|---|---|---|
| 0 | 120 | 12.68 | 0 | 120 − 46 = 74 | 111 |
| 1 | 46 | 11.67 | 1.01 | 46 − 27 = 19 | 110 |
| 2 | 27 | 10.71 | 1.97 | 27 − 17 = 10 | 101 |
| 3 | 17 | 9.594 | 3.09 | 17 − 12 = 5 | 100 |
| 4 | 12 | 8.583 | 4.10 | 12 − 9 = 3 | 011 |
| 5 | 9 | 7.668 | 5.01 | 9 − 7 = 2 | 010 |
| 6 | 7 | 6.829 | 5.85 | 7 − 5 = 2 | 001 |
| 7 | 5 | 5.685 | 7.00 | 5 − 0 = 5 | 000 |

The number of unit-width MOSFETs that are activated for each of the goal attenuation values is shown in the second column. The gain resulting from the activation of each of the unit-width MOSFET counts is shown in the third column, as determined by circuit simulation. The gain values in the third column change substantially linearly, with a step size of approximately 1 dB for a range of 5.685 to 12.68. The attenuation resulting from the activation of each of the unit-width MOSFET counts is shown in the fourth column, as determined by circuit simulation. The attenuation values in the fourth column change substantially linearly, with a step size of approximately 1 dB for a range of 0 to 7.00.

The binary gain code values in the last column are 3-bits so that eight different gain codes are available to program eight different gain levels. In other embodiments, the number of binary gain codes may be greater or less than eight. The fifth column of TABLE 1 computes the number of unit-width MOSFETs that are each one of the gate structures 410, 411, 412, 413, 414, 415, 416, and 417. Specifically, there are 5, 2, 2, 3, 5, 10, 19, and 74 unit-width MOSFETs in the gate structures 410, 411, 412, 413, 414, 415, 416, and 417, respectively. Note that although the attenuation and gain values are approximately linear as the binary gain code increments, the number of unit-width MOSFETs that are activated to produce the linear attenuation and gain values is not linear.

To set the attenuation to 7.00 dB, the gain code is programmed to 000 and the controller 140 activates the gate structure 410 and deactivates the gate structures 411, 412, 413, 414, 415, 416, and 417. To set the attenuation to 5.85 dB, the gain code is programmed to 001 and the controller 140 activates the gate structures 410 and 411 and deactivates the gate structures 412, 413, 414, 415, 416, and 417. To set the attenuation to 5.01 dB, the gain code is programmed to 010 and the controller 140 activates the gate structures 410, 411, and 412 and deactivates the gate structures 413, 414, 415, 416, and 417. To set the attenuation to 4.10 dB, the gain code is programmed to 011 and the controller 140 activates the gate structures 410, 411, 412, and 413 and deactivates the gate structures 414, 415, 416, and 417. To set the attenuation to 3.09 dB, the gain code is programmed to 100 and the controller 140 activates the gate structures 410, 411, 412, 413, and 414 and deactivates the gate structures 415, 416, and 417. To set the attenuation to 1.97 dB, the gain code is programmed to 101 and the controller 140 activates the gate structures 410, 411, 412, 413, 414, and 415 and deactivates the gate structures 416, and 417. To set the attenuation to 1.01 dB, the gain code is programmed to 110 and the controller 140 activates the gate structures 410, 411, 412, 413, 414, 415, and 416 and deactivates the gate structure 417. To set the attenuation to 0 dB, resulting in a maximum gain of 12.68 dB, the gain code is programmed to 111 and the controller 140 activates the gate structures 410, 411, 412, 413, 414, 415, 416, and 417. In one embodiment, the controller 140 receives a gain code including at least 3 bits and generates the Gs[7:0] signal with any combination of bits asserted to selectively activate any combination of the gate structures 410, 411, 412, 413, 414, 415, 416, and 417.

Figure 5:
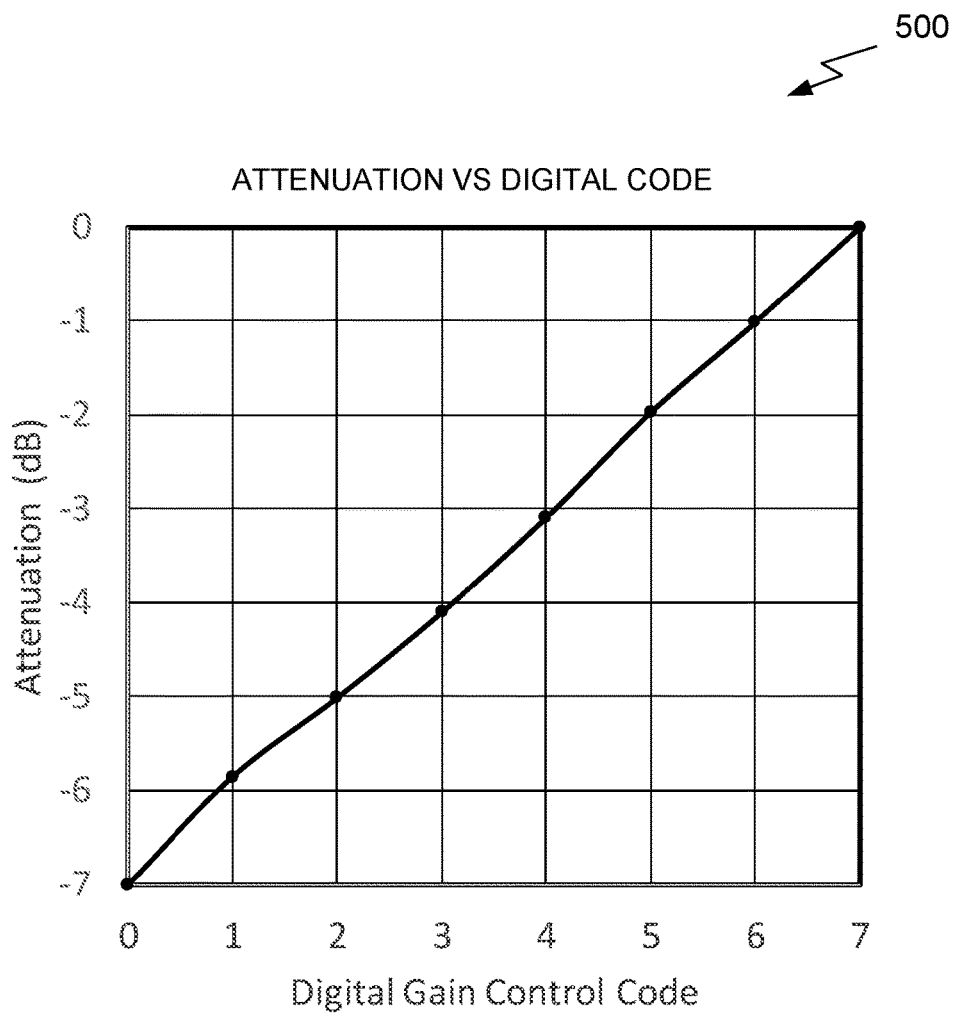
FIG. 5 illustrates a graph of the attenuation of a differential input voltage by the common source differential amplifier for values of the digital gain control code (gain code), in accordance with one embodiment.

FIG. 5 is a graph 500 of the attenuation of a differential input voltage by the common source differential amplifier 100 for values of the digital gain control code (gain code), in accordance with one embodiment. The graph 500 corresponds to the circuit 200 configured as a 60 GHz up-converter mixer using a 28 nm complementary metal-oxide semiconductor (CMOS) technology. As can be seen from the graph 500, the attenuation is nearly linear for each step in the digital gain control code. By varying the width ratio, the common source differential amplifier 100 and 150 may be designed to have a linear gain (in the dB scale) for sequential values of the digital gain control code.

Figure 6:
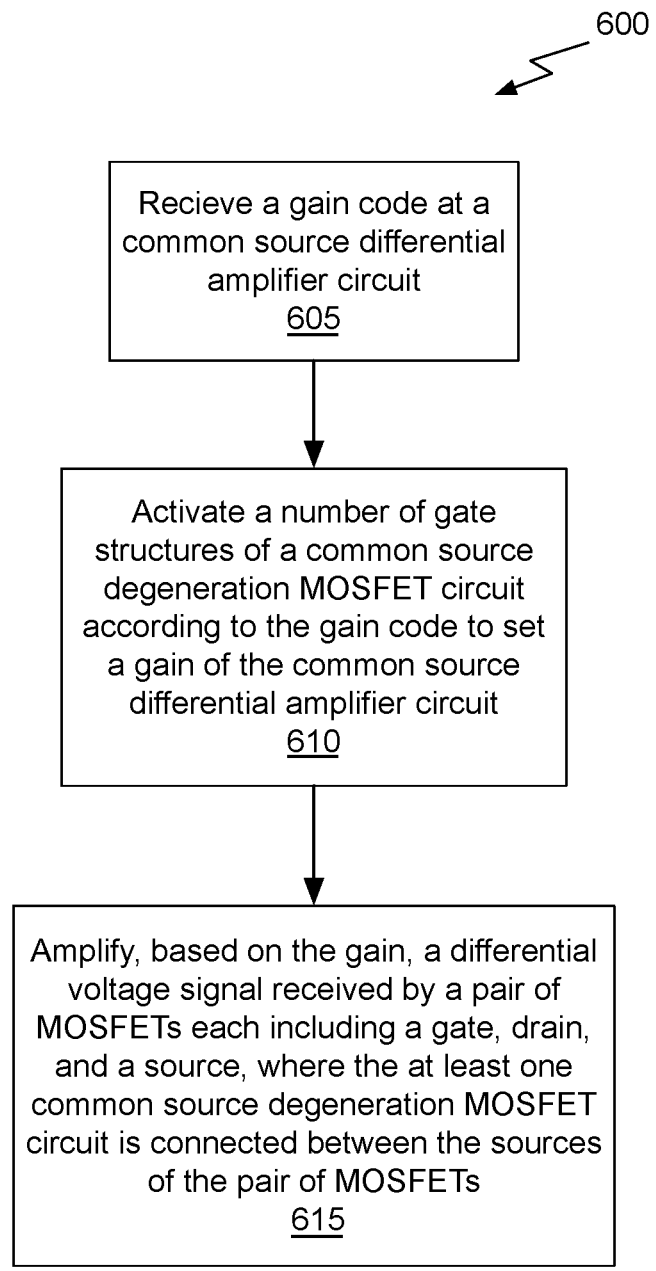
FIG. 6 is a flowchart of a method for controlling a gain of the common source differential amplifier, in accordance with one embodiment.

FIG. 6 is a flowchart of a method 600 for controlling a gain of the common source differential amplifier 100 or 150, in accordance with one embodiment. As an option, the method 600 may be implemented in the context of any one or more of the embodiments set forth in any previous and/or subsequent figure(s) and/or description thereof. For example, the method 600 may be implemented for amplifying a differential voltage input in the context of the common source differential amplifier 100 of FIG. 1, the common source differential amplifier 150 of FIG. 2, or any other embodiment.

At step 605, a gain code is received at the controller 140 that is coupled to a plurality of gate structures the common source degeneration MOSFET circuit 110. At step 610, the controller 140 selectively activates one or more of the gate structures for controlling the gain of the common source differential amplifier 100 or 150 according to the gain code. At step 615, a differential voltage signal received by a pair of MOSFETs each including a gate, a drain, and a source, is amplified based on the gain. The at least one common source degeneration MOSFET circuit 110 is connected between the sources of the pair of MOSFETs 105 and 115.

In summary, unlike a conventional tunable resistor, the gate structures within the source degeneration MOSFET circuit 110 closely track the pair of input MOSFETs 105 and 115 across PVT process corners. Therefore, linear voltage control can be achieved by controlling the width of the source degeneration MOSFET circuit 110 because the PVT behavior of the source degeneration MOSFET circuit 110 and pair of input MOSFETs 105 and 115 is similar. The performance of the gain control feature of the common source differential amplifier is relatively independent of PVT. Additionally, the size of the source degeneration MOSFET circuit 110 consumes less silicon area compared with the conventional tunable resistor constructed as an array of switches and poly silicon resistors. The smaller area results in fewer parasitic capacitances and improved high frequency performance of the common source differential amplifier 100 or 150.

Figure 7:
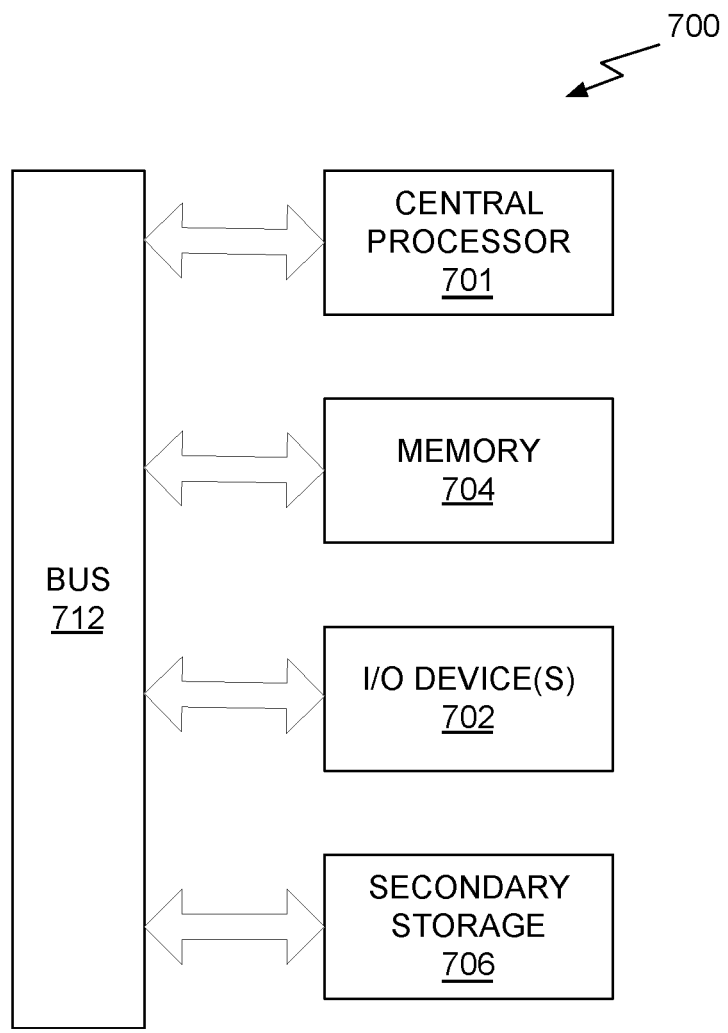
FIG. 7 illustrates an exemplary processing system, in accordance with one embodiment.

FIG. 7 illustrates an exemplary processing system 700, in accordance with one embodiment. As shown, a processing system 700 is provided including a plurality of devices that are connected to a communication bus 712. The devices include a processor 701, a memory 704, input/output (I/O) device(s) 702, and a secondary storage 706. One or more of the devices may include the common source differential amplifier 100 or 150. A gain code for each common source differential amplifier 100 or 150 may be generated by a controller within the device that contains the common source differential amplifier 100 or 150. The gain code may be generated in response to a measured voltage level within the device. When the measured voltage level rises above a first threshold value or falls below a second threshold value, the gain code may be generated to decrease or increase the gain of the common source differential amplifier 100 or 150.

The processing system 700 also includes the memory 704 (e.g. random access memory (RAM), etc.). The processing system 700 may also include the secondary storage 706. The secondary storage 706 includes, for example, a hard disk drive and/or a removable storage drive, a floppy disk drive, a magnetic tape drive, a compact disk drive, etc. The removable storage drive reads from and/or writes to a removable storage unit in a well-known manner. The processing system 700 may also include the I/O device(s) 702. Output devices may include a conventional CRT (cathode ray tube), LCD (liquid crystal display), LED (light emitting diode), plasma display or the like. User input may be received from the I/O device(s) 702, e.g., keyboard, mouse, touchpad, microphone, gaze tracking, and the like. The communication bus 712 may be implemented using any suitable protocol.

Computer programs, or computer control logic algorithms, may be stored in the memory 704, the secondary storage 706, and/or any other memory, for that matter. Such computer programs, when executed, enable the processing system 700 to perform various functions (as set forth above including, but not limited to those of a scheduling engine, for example). Memory 704, secondary storage 706 and/or any other storage are possible examples of tangible computer-readable media.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards, digital video disks, Bernoulli cartridges, random access memory (RAM), read-only memory (ROM), or the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical, or electromagnetic format. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; or the like.

It should be understood that the arrangement of components illustrated in the Figures described are exemplary and that other arrangements are possible. It should also be understood that the various system components (and means) defined by the claims, described below, and illustrated in the various block diagrams represent logical components in some systems configured according to the subject matter disclosed herein.

For example, one or more of these system components (and means) may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine) and/or as specialized circuits or circuitry (e.g., discreet logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various of the acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the embodiments as claimed.

The embodiments described herein included the one or more modes known to the inventor for carrying out the claimed subject matter. Of course, variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An apparatus, comprising:
   a common source differential amplifier including:
      a pair of a metal-oxide-semiconductor field effect transistors (MOSFETs) each including a gate terminal, a drain terminal, and a source terminal;
      at least one common source degeneration MOSFET circuit coupled between the source terminals of the pair of MOSFETs and configured to selectively limit current flow, the at least one common source degeneration MOSFET circuit including a plurality of gate structures,
      wherein one or more gate structures of the plurality of gate structures is selectively activated for controlling a gain of the common source differential amplifier; and
   a controller that is coupled to the at least one common source degeneration MOSFET circuit and configured to activate the one or more gate structures to control a ratio between a first gate width of the collective one or more gate structures that are activated and a second gate width of either MOSFET in the pair of MOSFETs.

2. The apparatus of claim 1, wherein the second gate width is fixed, and each gate structure in the plurality of gate structures includes one or more MOSFETs of the second gate width.

3. The apparatus of claim 1, wherein the controller is configured to set the gain in equal size adjustment increments.

4. The apparatus of claim 1, wherein an effective resistance of the at least one common source degeneration MOSFET circuit is a function of the ratio.

5. The apparatus of claim 1, wherein each MOSFET of the pair of MOSFETs and the plurality of gate structures have at least one common aspect including at least one of: a common type, a common gate length, a common electron mobility, a common gate capacitance, or a common circuit layout topology.

6. The apparatus of claim 1, wherein the common source differential amplifier is configured such that the gain control is independent of at least one of a process by which the common source differential amplifier is manufactured, a voltage at which the common source differential amplifier operates, or a temperature at which the common source differential amplifier operates.

7. An apparatus, comprising:
 a common source differential amplifier including:
  a pair of a metal-oxide-semiconductor field effect transistors (MOSFETs) each including a gate terminal, a drain terminal, and a source terminal; and
  at least one common source degeneration MOSFET circuit coupled between the source terminals of the pair of MOSFETs and configured to selectively limit current flow, the at least one common source degeneration MOSFET circuit including a plurality of gate structures,
  wherein one or more gate structures of the plurality of gate structures is selectively activated for controlling a gain of the common source differential amplifier,
  wherein the common source differential amplifier includes at least two of the common source degeneration MOSFET circuits serially coupled between the sources of the pair of MOSFETs.

8. The apparatus of claim 1, wherein the gain of the common source differential amplifier is controlled without a resistor coupled between the sources of the pair of MOSFETs.

9. An apparatus, comprising:
 a common source differential amplifier including:
  a pair of a metal-oxide-semiconductor field effect transistors (MOSFETs) each including a gate terminal, a drain terminal, and a source terminal; and
  at least one common source degeneration MOSFET circuit coupled between the source terminals of the pair of MOSFETs and configured to selectively limit current flow, the at least one common source degeneration MOSFET circuit including a plurality of gate structures,
  wherein one or more gate structures of the plurality of gate structures is selectively activated for controlling a gain of the common source differential amplifier,
  wherein a first gate structure of the plurality of gate structures has a first gate width and a second gate structure of the plurality of gate structures has a second gate width that is larger than the first gate width.

10. A method of controlling a gain of a common source differential amplifier, comprising:
 receiving a gain code at a controller that is coupled to a plurality of gate structures of at least one common source degeneration metal-oxide-semiconductor field effect transistor (MOSFET) circuit;
 selectively activating one or more of the gate structures in the plurality of gate structures for controlling the gain of the common source differential amplifier according to the gain code; and
 amplifying, based on the gain, a differential voltage signal received by a pair of a MOSFETs each including a gate terminal, a drain terminal, and a source terminal,
  wherein the at least one common source degeneration MOSFET circuit is coupled between the sources of the pair of MOSFETs,
  wherein the controller activates the one or more gate structures to control a ratio between a first gate width of the collective one or more gate structures that are activated and a second gate width of each MOSFET in the pair of MOSFETs.

11. The method of claim 10, wherein the second gate width is fixed, and each gate structure in the plurality of gate structures includes one or more MOSFETs of the second gate width.

12. The method of claim 10, wherein the controller is configured to set the gain in equal size adjustment increments.

13. The method of claim 10, wherein an effective resistance of the at least one common source degeneration MOSFET circuit is a function of the ratio.

14. The method of claim 10, wherein each in the pair of MOSFETs and the plurality of gate structures, each have at least one common aspect including at least one of: a common type, a common gate length, a common electron mobility, a common gate capacitance, or a common circuit layout topology.

15. The method of claim 10, wherein the common source differential amplifier is configured such that the gain control is independent of at least one of a process by which the common source differential amplifier is manufactured, a voltage at which the common source differential amplifier operates, or a temperature at which the common source differential amplifier operates.

16. A method of controlling a gain of a common source differential amplifier, comprising:
 receiving a gain code at a controller that is coupled to a plurality of gate structures of at least one common source degeneration metal-oxide-semiconductor field effect transistor (MOSFET) circuit;
 selectively activating one or more of the gate structures in the plurality of gate structures for controlling the gain of the common source differential amplifier according to the gain code; and
 amplifying, based on the gain, a differential voltage signal received by a pair of a MOSFETs each including a gate terminal, a drain terminal, and a source terminal,
  wherein the at least one common source degeneration MOSFET circuit is coupled between the sources of the pair of MOSFETs,
  wherein the common source differential amplifier includes at least two of the common source degeneration MOSFET circuits serially coupled between the sources of the pair of MOSFETs.

17. The method of claim 10, wherein the gain of the common source differential amplifier is controlled without a resistor coupled between the sources of the pair of MOSFETs.

18. A method of controlling a gain of a common source differential amplifier, comprising:
 receiving a gain code at a controller that is coupled to a plurality of gate structures of at least one common source degeneration metal-oxide-semiconductor field effect transistor (MOSFET) circuit;
 selectively activating one or more of the gate structures in the plurality of gate structures for controlling the gain of the common source differential amplifier according to the gain code; and
 amplifying, based on the gain, a differential voltage signal received by a pair of a MOSFETs each including a gate terminal, a drain terminal, and a source terminal,
  wherein the at least one common source degeneration MOSFET circuit is coupled between the sources of the pair of MOSFETs, wherein a first gate structure of the plurality of gate structures has a first gate width and a second gate structure has a second channel width that is larger than the first gate width.

* * * * *